US012740123B2

(12) United States Patent
Yang et al.

(10) Patent No.: US 12,740,123 B2
(45) Date of Patent: Sep. 15, 2026

(54) HIGH ELECTRON MOBILITY TRANSISTOR AND METHOD OF FORMING THE SAME

(71) Applicant: UNITED MICROELECTRONICS CORP., Hsin-Chu City (TW)

(72) Inventors: Tsung-Mu Yang, Tainan City (TW); Yu-Ren Wang, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 646 days.

(21) Appl. No.: 18/113,076

(22) Filed: Feb. 23, 2023

(65) Prior Publication Data

US 2023/0207643 A1 Jun. 29, 2023

Related U.S. Application Data

(63) Continuation-in-part of application No. 16/843,851, filed on Apr. 8, 2020, now Pat. No. 11,616,135.

(30) Foreign Application Priority Data

Feb. 6, 2020 (CN) ......................... 202010081665.5

(51) Int. Cl.
*H10D 62/82* (2025.01)
*H10D 30/01* (2025.01)
(Continued)

(52) U.S. Cl.
CPC ......... *H10D 64/118* (2025.01); *H10D 30/015* (2025.01); *H10D 30/475* (2025.01); *H10D 62/824* (2025.01); *H10D 62/8503* (2025.01)

(58) Field of Classification Search
CPC ................. H03H 3/08; H03H 9/02976; H03H 2001/0064; H10D 30/015; H10D 30/475; H10D 30/6737; H10D 30/6738; H10D 30/675; H10D 62/85; H10D 62/8503; H10D 64/01; H10D 64/258; H10D 64/64; H10D 62/149; H10D 62/343; H10D 64/256; H10D 84/811; H10D 84/01; H10D 84/05; H10D 84/40; H10D 8/60; H10D 8/051; H10D 8/50; H10D 62/8325; H10D 62/126; H10D 62/60; H10D 62/106; H10D 62/102;
(Continued)

(56) References Cited

U.S. PATENT DOCUMENTS 7,576,373 B1 8/2009 Hikita
7,638,819 B2 12/2009 Kikkawa et al.
(Continued)

FOREIGN PATENT DOCUMENTS

CN 101022128 A 8/2007

*Primary Examiner* — Moin M Rahman
(74) *Attorney, Agent, or Firm* — Winston Hsu

(57) ABSTRACT

A high electron mobility transistor (HEMT) includes a substrate, a P-type III-V composition layer, a gate electrode and a carbon containing layer. The P-type III-V composition layer is disposed on the substrate, and the gate electrode is disposed on the P-type III-V composition layer. The carbon containing layer is disposed under the P-type III-V composition layer and includes a sunken surface, so as to function like an out diffusion barrier for preventing from the dopant within the P-type III-V composition layer diffusing into the stacked layers underneath during the annealing process.

19 Claims, 5 Drawing Sheets

(51) Int. Cl.

| | |
|---|---|
| ***H10D 30/47*** | (2025.01) |
| ***H10D 62/824*** | (2025.01) |
| ***H10D 62/85*** | (2025.01) |
| ***H10D 64/00*** | (2025.01) |

(58) Field of Classification Search

CPC .. H10D 62/124; H10D 64/118; H10D 62/824; H10D 62/854; H10D 62/117; H10D 30/47–485; H10F 71/1278; H10F 77/1246; H10F 77/146; H10F 77/206; H10F 30/223; H10F 39/103

See application file for complete search history.

(56) References Cited

U.S. PATENT DOCUMENTS

| | | | | |
|---|---|---|---|---|
| 8,404,508 | B2 | 3/2013 | Lidow et al. | |
| 2008/0079023 | A1 | 4/2008 | Hikita | |
| 2010/0090225 | A1 | 4/2010 | Sato | |
| 2014/0091315 | A1 | 4/2014 | Yamada | |
| 2014/0103459 | A1 | 4/2014 | Kinoshita | |
| 2014/0183545 | A1 | 7/2014 | Hoke | |
| 2014/0252368 | A1 | 9/2014 | Lee | |
| 2015/0041825 | A1 | 2/2015 | Liu | |
| 2016/0099345 | A1* | 4/2016 | Ramer | H10D 30/4755 438/172 |
| 2016/0126312 | A1 | 5/2016 | Moens | |
| 2016/0240679 | A1 | 8/2016 | Chen | |
| 2017/0104091 | A1 | 4/2017 | Tanaka | |
| 2017/0125567 | A1 | 5/2017 | Yamada | |
| 2017/0207300 | A1 | 7/2017 | Pei | |
| 2018/0012960 | A1* | 1/2018 | Kinoshita | H10D 62/106 |
| 2018/0026124 | A1 | 1/2018 | Shimizu | |
| 2018/0145148 | A1 | 5/2018 | Yamada | |
| 2019/0148485 | A1 | 5/2019 | Hamada | |
| 2019/0157081 | A1* | 5/2019 | Zhao | H10P 14/3252 |
| 2019/0229203 | A1* | 7/2019 | Iucolano | H10D 30/015 |
| 2020/0006543 | A1* | 1/2020 | Tu | H10D 64/251 |

* cited by examiner

HIGH ELECTRON MOBILITY TRANSISTOR AND METHOD OF FORMING THE SAME

CROSS REFERENCE TO RELATED APPLICATIONS

This application is a continuation-in-part of U.S. application Ser. No. 16/843,851, filed on Apr. 8, 2020. The content of the application is incorporated herein by reference.

BACKGROUND OF THE INVENTION

1. Field of the Invention

The present invention relates to a high electron mobility transistor (HEMT) and a method of forming the same, and more particularly, to a high electron mobility transistor having an additional carbon containing layer, and a method of forming the same.

2. Description of the Prior Art

Due to their semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different band-gaps are combined and a heterojunction is formed at the junction between the semiconductor materials as a channel for carriers. In recent years, gallium nitride (GaN) based materials have been applied in the high power and high frequency products because of their properties of wider band-gap and high saturation velocity. A two-dimensional electron gas (2DEG) may be generated by the piezoelectricity property of the GaN-based materials, and the switching velocity may be enhanced because of the higher electron velocity and the higher electron density of the two-dimensional electron gas.

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices. However, with the upgrading of electronic products, the structure and fabrication of the high electron mobility transistors need to be further improved to meet the industrial requirements to gain diverse functionality.

SUMMARY OF THE INVENTION

One of the objectives of the present invention provides a high electron mobility transistor (HEMT) and a method of forming the same. The high electron mobility transistor includes an additional out diffusion barrier which may prevent from the dopant within the P-type III-V composition layer diffusing into the stacked layers underneath during the annealing process, thereby avoiding the electrical properties of the high electron mobility transistor being affected by diffused dopants.

To achieve the purpose described above, one embodiment of the present invention provides a high electron mobility transistor including a substrate, a channel layer, a barrier layer, a P-type III-V composition layer, a gate electrode, and a carbon containing layer. The channel layer is disposed on the substrate, and the barrier layer is disposed on the channel layer. The P-type III-V composition layer is disposed on the barrier layer, and the gate electrode disposed on the P-type III-V composition layer. The carbon containing layer is disposed on the channel layer, between the P-type III-V composition layer and the barrier layer, wherein the carbon containing layer includes a sunken surface.

To achieve the purpose described above, another embodiment of the present invention provides a method of forming high electron mobility transistor, including the following steps. Firstly, a substrate is provided, and a channel layer is formed on the substrate and a barrier layer is formed on the channel layer. Next, a P-type III-V composition layer is formed on the barrier layer, and a gate electrode is formed on the P-type III-V composition layer. Then, a carbon containing layer is formed on the channel layer, between the P-type III-V composition layer and the barrier layer, wherein the carbon containing layer includes a sunken surface.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 2 are schematic diagrams illustrating a method of forming a high electron mobility transistor according to a first embodiment in the present invention; in which:

FIG. 1 shows a cross-sectional view of a high electron mobility transistor after forming a gate electrode; and FIG. 2 shows a cross-sectional view of a high electron mobility transistor after forming source/drain electrodes.

FIG. 7 to FIG. 8 are schematic diagrams illustrating a method of forming a high electron mobility transistor according to a third embodiment in the present invention; in which:

FIG. 7 shows a cross-sectional view of a high electron mobility transistor after forming a gate electrode; and FIG. 8 shows a cross-sectional view of a high electron mobility transistor after forming source/drain electrodes.

DETAILED DESCRIPTION

To provide a better understanding of the presented invention, preferred embodiments will be described in detail. The preferred embodiments of the present invention are illustrated in the accompanying drawings with numbered elements.

Figure 1:
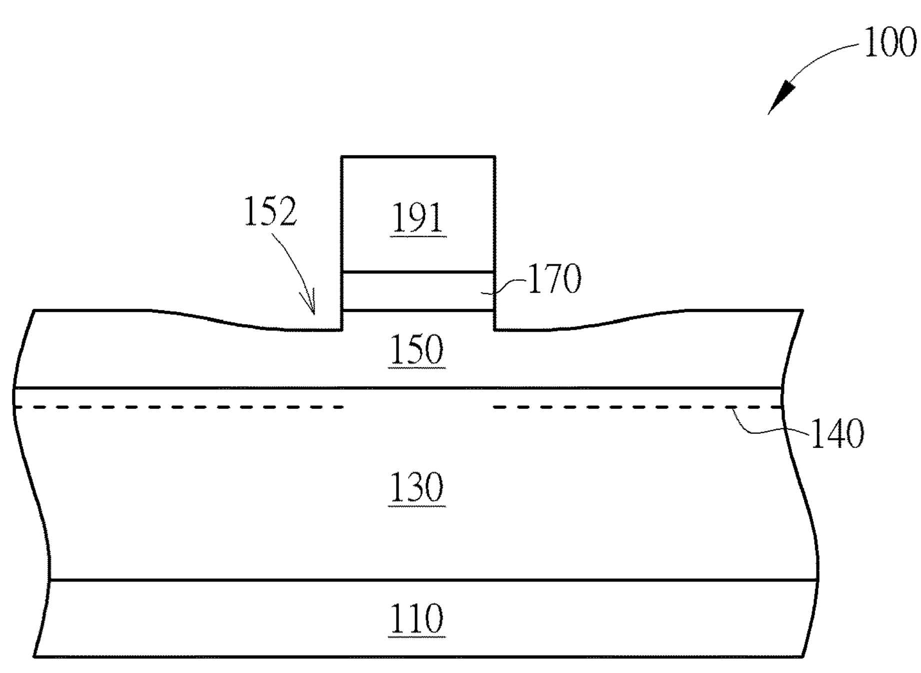
Figure 2:
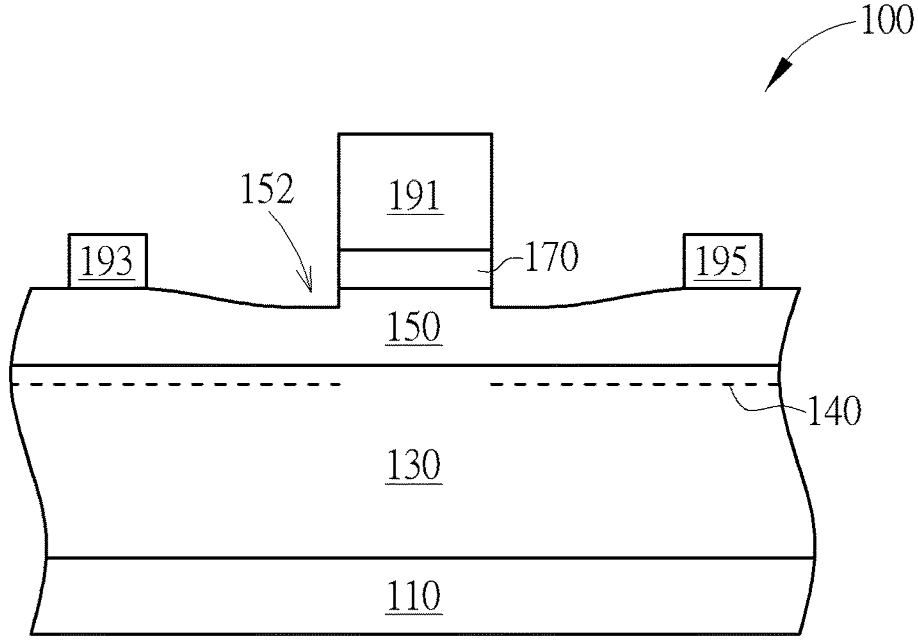

Please refer to FIG. 1 to FIG. 2, which are schematic diagrams illustrating a method of forming a high electron mobility transistor 100 according to the first embodiment in the present invention. As shown in FIG. 1, a high electron mobility transistor 100 is formed by first providing a substrate 110, and the substrate 110 may be formed by silicon or other semiconductor material. In one embodiment, the substrate 110 may include a silicon layer with <111> lattice structure, but not limited thereto. In another embodiment, the substrate 110 may also include a semiconductor compound such as silicon carbide (SiC), gallium arsenide (GaAs), indium arsenide (InAs) or indium phosphide (InP), or a semiconductor alloy such as silicon germanium (SiGe), silicon germanium carbide (SiGeC), gallium arsenide phosphide (AsGaP) or indium gallium phosphide (InGaP). Then, a channel layer 130 and a barrier layer 150 are sequentially formed on the substrate 110. The channel layer 130 and the barrier layer 150 may respectively include different III-V materials, so that, a heterojunction is formed between the channel layer 130 and the barrier layer 150, thereby leading to discontinuous band-gaps. In the present embodiment, the barrier layer 150 may include aluminum gallium nitride ($Al_{x1}Ga_{1-x1}N$, with 0.1 being a constant greater than 0 and less than 1), the channel layer 130 may include gallium nitride (GaN), and the band-gap of the barrier layer 150 is greater than the band-gap of the channel layer 130. Accordingly, the electron of the barrier layer 150 generated by the piezoelectricity may fall in the channel layer 130, thereby forming a high mobility electron film namely a two-dimensional electron gas (2DEG) 140 within the channel layer 130 and adjacent to the barrier layer 150, as shown in FIG. 1. In one embodiment, a buffer layer (not shown in the drawings) may further be formed under the channel layer 130, and the buffer layer may include the same material as the channel layer 130, such as gallium nitride.

Furthermore, a P-type III-V composition layer 170 is formed on the barrier layer 150, and a gate electrode 191 is formed on the P-type III-V composition layer 170, with sidewalls of the P-type III-V composition layer 170 being vertical aligned with two sidewalls of the gate electrode 191, as shown in FIG. 1. The P-type III-V composition layer 170 may include a divalent dopant, such as magnesium (Mg), zinc (Zn), calcium (Ca), beryllium (Be) or iron (Fe). The divalent dopant may occupy the original space of the III-V compound within a portion of the channel layer 130 which is right below the gate electrode 191, depleting the two-dimensional electron gas 140 to form a normally off channel. Accordingly, the high electron mobility transistor 100 of the present embodiment may also become a normally off device. In the present embodiment, the P-type III-V composition layer 170 includes but not limited to P-type doped gallium nitride (pGaN), and the divalent dopant preferably includes magnesium. In another embodiment, the P-type III-V composition layer 170 may also include P-type doped aluminum gallium nitride (pAlGaN) or P-type doped indium gallium nitride (p-InGaN), or includes a multilayer structure, and the gate electrode 191 may include titanium (Ti), aluminum (Al), titanium nitride (TiN), or other suitable conductive materials.

In one embodiment, each stacked layer (including the channel layer 130, the barrier layer 150 and the P-type III-V composition layer 170) of the high electron mobility transistor 100 may be formed through an epitaxial process, such as a metal organic chemical vapor deposition (MOCVD) process, a molecular beam epitaxy (MBE) process, or a hydride vapor phase epitaxy (HVPE) process, but not limited thereto. In the present embodiment, the formation of the P-type III-V composition layer 170 and the gate electrode 191 is for example accomplished by sequentially forming a P-type III-V material layer (not shown in the drawings) and a gate electrode layer (not shown in the drawings) to cover the entire surfaces of the barrier layer 150, followed by performing an etching process to partially remove the P-type III-V material layer and the gate electrode layer, thereby forming the gate electrode 191 and the P-type III-V composition layer 170. Then, an annealing process may be performed after implanting the divalent dopant into the P-type III-V composition layer 170, so that, the divalent dopant may be uniformly diffused in the P-type III-V composition layer 170.

It is noted that, since the material of the P-type III-V material layer is similar to the material of the barrier layer 150 underneath, a portion of the P-type III-V material layer which is closed to the gate electrode 191 may be etched rapidly, and a portion of the P-type III-V material layer which is away from the gate electrode 191 may be etched slowly. Accordingly, a portion of the barrier layer 150, such as the portion of the barrier layer 150 closed to the gate electrode 191, is also removed while partially removing the P-type III-V material layer. Then, a recess 152 is formed on the barrier layer 150, and the recess 152 includes a sunken surface adjacent to the gate electrode 191, with a depth of the sunken surface being gradually increased with the approach to the gate electrode 191, as shown in FIG. 1.

Next, as shown in FIG. 2, a source electrode 193 and a drain electrode 195 are formed on the barrier layer 150, at two sides of the P-type III-V composition layer 170 and the gate electrode 191, respectively. The source electrode 193 and the drain electrode 195 may include titanium, aluminum, titanium nitride, or other suitable conductive materials. According to these, the forming method of the high electron mobility transistor 100 according to the first embodiment in the present invention is accomplished.

People well known in the arts should easily realize the high electron mobility transistor and the forming method thereof in the present invention is not limited to the aforementioned embodiment, and may further include other examples or variety. For example, a high electron mobility transistor according to another embodiment may be provided to improve diffused the divalent dopant being diffused from the P-type III-V composition layer 170 into the stacked layers such as the barrier layer 150 or the channel layer 130 underneath. The following description will detail the different embodiments of the high electron mobility transistor and the forming method thereof in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 3:
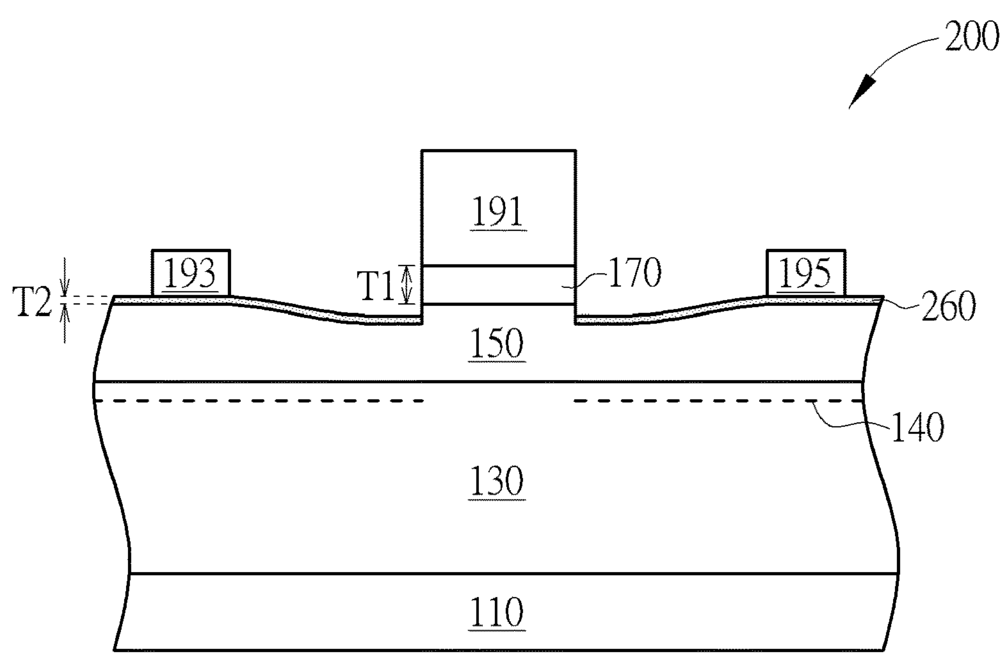
FIG. 3 is a schematic diagram illustrating a method of forming a high electron mobility transistor according to a second embodiment in the present invention.

Please refer to FIG. 3, which is a schematic diagram illustrating a method of forming a high electron mobility transistor 200 according to the second embodiment in the present invention. The structure and the forming process of the high electron mobility transistor 200 are substantially similar to that in the first embodiment as shown in FIG. 2, and the high electron mobility transistor 200 also includes the substrate 110, the channel layer 130, the barrier layer 150, the two-dimensional electron gas 140, the P-type III-V composition layer 170, the gate electrode 191, the source electrode 193 and the drain electrode 195. All similarity between the present embodiment and the aforementioned embodiment will not be redundant described hereinafter. The difference between the present embodiment and the aforementioned first embodiment is in that a carbon containing layer 260 is additionally formed on the barrier layer 150, after forming the P-type III-V composition layer 170 and the gate electrode 191.

Precisely speaking, the carbon containing layer 260 is conformally formed on the barrier layer 150, as well as the recess 152 thereof, after forming the structure as shown in FIG. 1, so that, the carbon containing layer 260 is disposed between the P-type III-V composition layer 170 and the barrier layer 150 to obtain a sunken surface corresponding, and the source electrode 193 and the drain electrode 195 are disposed on the carbon containing layer 260, also at two sides of the gate electrode 191, as shown in FIG. 3. It is noted that, the carbon containing layer 260 for example includes any suitable material containing carbon elements or doped with carbon atoms, for example silicon carbide (SiC) or carbon doped III-V compounds, with the doped concentration of carbon thereof being about 1E15 to 1E21 in per cubic centimeter (1E15-1E21/$cm^3$). In the present embodiment, the carbon containing layer 260 includes but not limited to carbon doped III-V compound, such as carbon doped gallium nitride (C:GaN), carbon doped aluminum gallium nitride (C:AlGaN), carbon doped silicon (C:Si), or carbon doped boron nitride (C:BN), and the carbon doping method is but not limited to an in-situ doping during the epitaxial process or an additional doping after the epitaxial process. In one embodiment, the material of the carbon containing layer 260 may be further adjustable based on the material of the P-type III-V composition layer 170 disposed above. For example, while the P-type III-V composition layer 170 includes but not limited to P-type gallium nitride (pGaN), the carbon containing layer 260 underneath preferably includes carbon doped gallium nitride, but not limited thereto; while the P-type III-V composition layer 170 includes but not limited to P-type aluminum gallium nitride (pAlGaN), the carbon containing layer 260 underneath preferably includes carbon doped aluminum gallium nitride, but not limited thereto. Furthermore, in the carbon containing layer 260 of the present embodiment, the overall carbon concentration in the carbon doped III-V compound may be 1E15 to 1E21 in per cubic centimeter (1E15-1E21/$cm^3$), preferably between 1E18 and 1E20 in per cubic centimeter (1E18-1E20/$cm^3$), to reach the lowest carbon concentration which is enable to block the divalent dopant of the P-type III-V composition layer 170 diffusing downwardly.

It is also noted that, the carbon containing layer 260 has a relative smaller thickness in comparison with other stacked layers (including the channel layer 130, the barrier layer 150 and the P-type III-V composition layer 170), to avoid the distances between the P-type III-V composition layer 170 and the two-dimensional electron gas 140 being excessively increased, and to prevent from the depletion of the P-type III-V composition layer 170 on the two-dimensional electron gas 140 being affected thereby. In one embodiment, a thickness T2 of the carbon containing layer 260 is for example about 1/100 to 1/10 of a thickness T1 of the P-type III-V composition layer 170. For example, the thickness T1 of the P-type III-V composition layer 170 may be about 60 to 80 nanometers (nm), and the thickness T2 of the carbon containing layer 260 may be about 1 to 5 nanometers, preferably to 1 to 2 nanometers, but not limited thereto.

Through these arrangements, the forming method of the high electron mobility transistor 200 according to the second embodiment in the present invention is accomplished. According to the present embodiment, the carbon containing layer 260 is additionally formed to function like an out diffusion barrier thereby preventing from the divalent dopant within the P-type III-V composition layer 170 being diffused into the stacked layers underneath during the annealing process, and also to function like an etching stop layer while forming the source electrode 193 and the drain electrode 195 thereby preventing form the barrier layer 150 being further recesses during patterning a source electrode layer (not shown in the drawings) and a drain electrode layer (not shown in the drawings). Then, the high electron mobility transistor 200 of the present embodiment is allowable to gain better electrical properties and performances.

Figure 4:
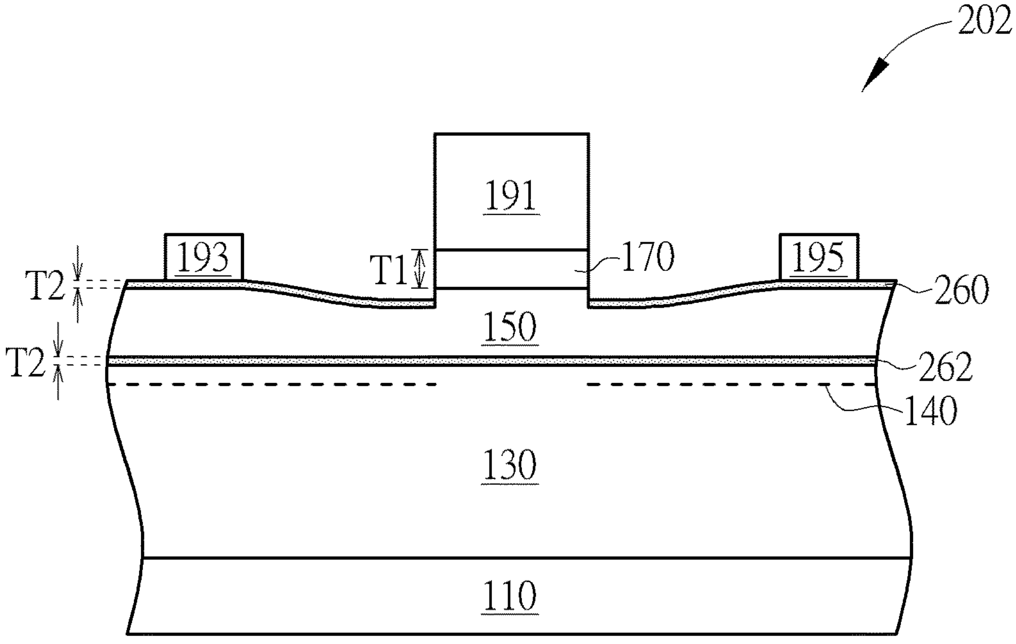
FIG. 4 is a schematic diagram illustrating a cross-sectional view of a high electron mobility transistor according to another embodiment in the present invention.

Please refer to FIG. 4, which is a schematic diagram illustrating a cross-sectional view of a high electron mobility transistor 202 according to another embodiment in the present invention. The structure of the high electron mobility transistor 202 is substantially similar to that of the aforementioned second embodiment as shown in FIG. 3, and the similarity therebetween will not be redundant described hereinafter. The difference between the present embodiment and the aforementioned embodiment is mainly in that another carbon containing layer 262 with a planar top surface is further formed between the barrier layer 150 and the channel layer 130.

Precisely speaking, the carbon containing layer 262 is additionally disposed between the barrier layer 150 and the channel layer 130, and which includes any suitable material containing carbon elements or doped with carbon atoms, for example silicon carbide or carbon doped III-V compounds, with the carbon doped III-V compounds including but not limited to carbon doped gallium nitride, carbon doped aluminum gallium nitride, carbon doped silicon, or carbon doped boron nitride. In a preferably embodiment, the P-type III-V composition layer 170 may include but not limited to P-type aluminum gallium nitride ($Al_{x3}Ga_{1-x3}N$), the barrier layer 150 includes aluminum gallium nitride ($Al_{x4}Ga_{1-x4}N$), and the carbon containing layer 262 includes carbon doped aluminum gallium nitride ($Al_{x5}Ga_{1-x5}N$), with all of $_{x3}$, $_{x4}$, $_{x5}$ being a constant greater than 0, and being between 0.1 and 0.5. In one embodiment, $_{x5}$ is greater than $_{x4}$ and $_{x4}$ is greater than $_{x3}$ ($_{x5}>_{x4}>_{x3}$), and in another embodiment, $_{x4}$ is greater than $_{x3}$ and $_{x4}$ is greater than $_{x5}$ ($_{x4}>_{x5}$, $_{x4}>_{x3}$), or $_{x3}$ is greater than $_{x4}$ and $_{x4}$ is greater than $_{x5}$ ($_{x3}>_{x4}>_{x5}$). For example, the P-type III-V composition layer 170 may include P-type aluminum gallium nitride ($Al_{0.1}Ga_{0.9}N$), the barrier layer 150 includes aluminum gallium nitride ($Al_{0.2}Ga_{0.8}N$), and the carbon containing layer 262 includes carbon doped aluminum gallium nitride ($C:Al_{0.3}Ga_{0.7}N$), or the P-type III-V composition layer 170 may include P-type aluminum gallium nitride ($Al_{0.1}Ga_{0.9}N$), the barrier layer 150 includes aluminum gallium nitride ($Al_{0.3}Ga_{0.7}N$), and the carbon containing layer 262 includes carbon doped aluminum gallium nitride ($C:Al_{0.2}Ga_{0.8}N$), or the P-type III-V composition layer 170 may include P-type aluminum gallium nitride ($Al_{0.3}Ga_{0.7}N$), the barrier layer 150 includes aluminum gallium nitride ($Al_{0.2}Ga_{0.8}N$), and the carbon containing layer 262 includes carbon doped aluminum gallium nitride ($C:Al_{0.1}Ga_{0.9}N$), but is not limited thereto. Furthermore, the thickness T2 of the carbon containing layer 262 is substantially the same as that of the carbon containing layer 260, for example being about 1/100 to 1/10 of the thickness T1 of the P-type III-V composition layer 170.

Though these arrangements, the two carbon containing layer 260, 262 are both functioned like an out diffusion barrier to prevent from the divalent dopant within the P-type III-V composition layer 170 diffusing into the channel layer 130 underneath during the annealing process. In comparison with the carbon containing layer 260, the carbon containing layer 262 is disposed at a relative deeper position for blocking any possible dopant diffused from the P-type III-V composition layer 170, so as to further improve the electrical property of the high electron mobility transistor 202.

Figure 5:
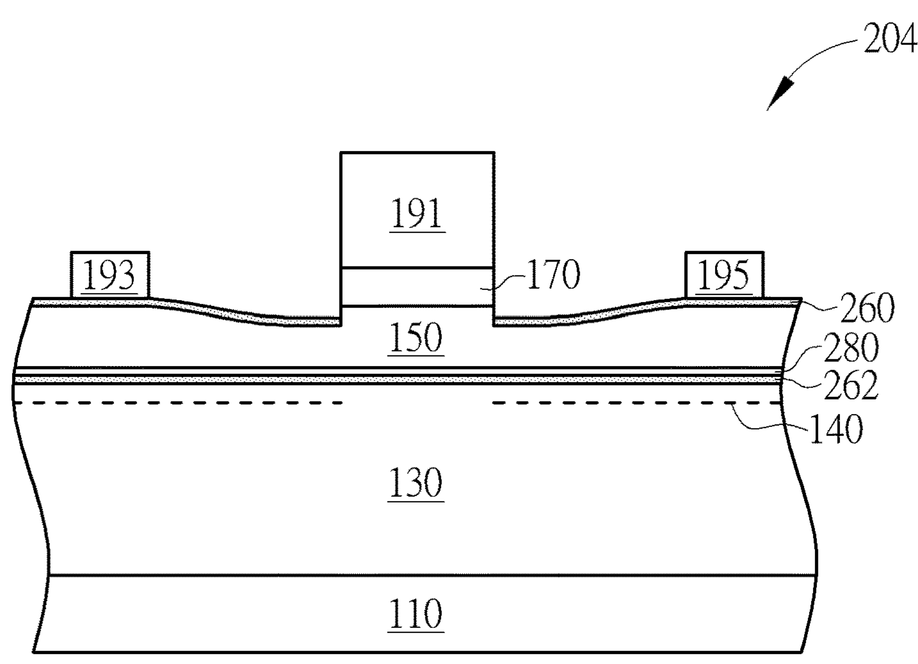
FIG. 5 is a schematic diagram illustrating a cross-sectional view of a high electron mobility transistor according to another embodiment in the present invention.
Figure 6:
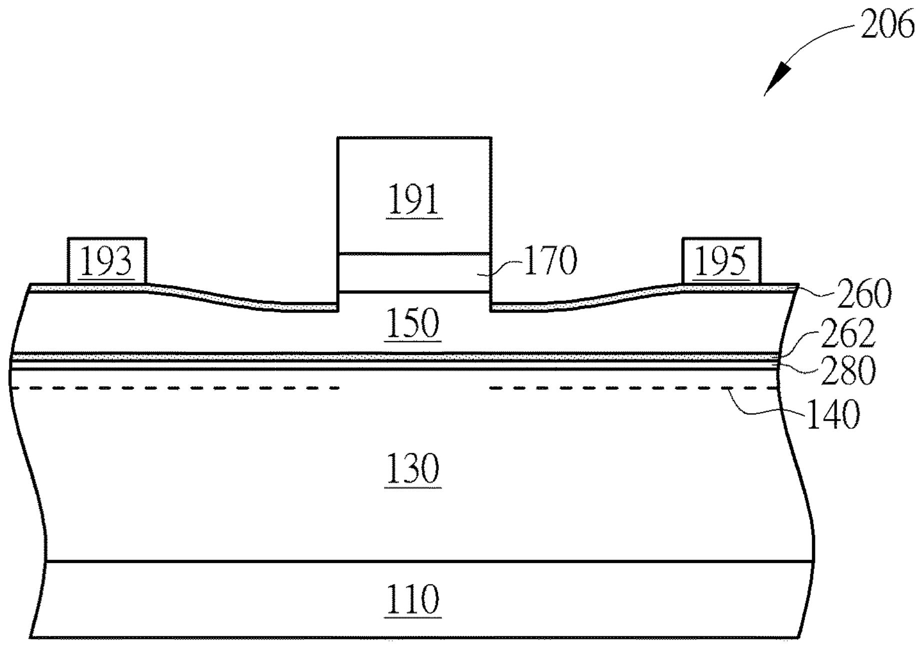
FIG. 6 is a schematic diagram illustrating a cross-sectional view of a high electron mobility transistor according to another embodiment in the present invention.

Please refer to FIG. 5 and FIG. 6, which are schematic diagrams respectively illustrating a cross-sectional view of a high electron mobility transistor 204/206 according to another embodiment in the present invention. The structure of the high electron mobility transistor 204/206 is substantially similar to that of the aforementioned second embodiment as shown in FIG. 4, and the similarity therebetween will not be redundant described hereinafter. The difference between the present embodiment and the aforementioned embodiment is mainly in that a spacer layer 280 is further disposed between the barrier layer 150 and the channel layer 130.

Precisely, the spacer layer 280 is either disposed on the carbon containing layer 262 as shown in FIG. 5, or under the carbon containing layer 262 as shown in FIG. 6, between the barrier layer 150 and the channel layer 130, and the spacer layer 280 may include a III-V material, preferably being different from the material of the barrier layer 150. Accordingly, the band gap of the barrier layer 150 may be different from that of the channel layer 130 as much as possible, so as to generate a relative larger amount of electrons to improve the electrical property of the high electron mobility transistor 204/206. In the present embodiment, the barrier layer 150 may include aluminum gallium nitride ($Al_{x2}Ga_{1-x2}N$, with $_{x2}$ being a constant greater than or equal to 0 and less than 1), and the spacer layer 280 includes but not limited to aluminum nitride (AlN). Also, the spacer layer 280 preferably includes a relative smaller thickness, for example being bout 1 to 5 nanometers, preferably being about 1 to 2 nanometers, for prevent from the depletion of the P-type III-V composition layer 170 on the two-dimensional electron gas 140 being affected thereby.

Through these arrangements, the spacer layer 280 further disposed between the barrier layer 150 and the channel layer 130 in the high electron mobility transistor 204/206 of the present embodiment is allowable to gain a greater amount of electrons, to further improve the electrical property of the high electron mobility transistor 204/206.

Figure 7:
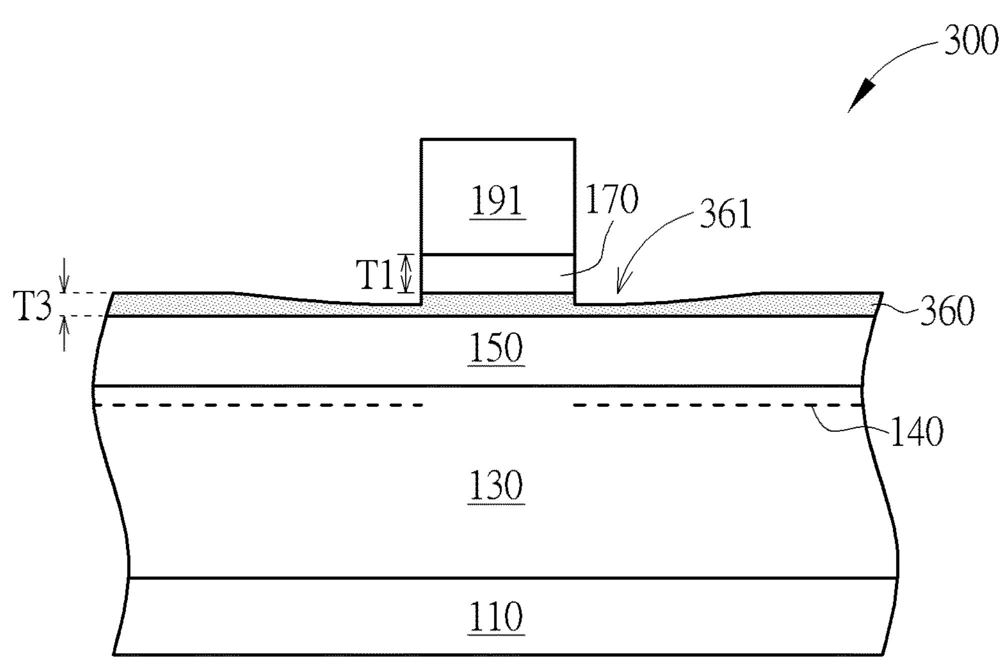
Figure 8:
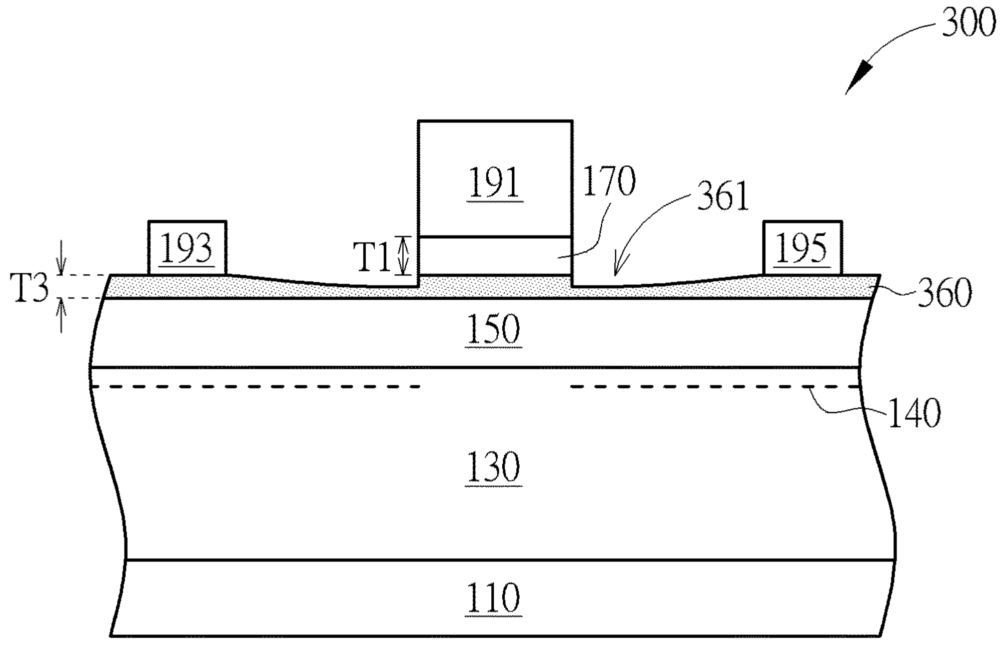

Please refer to FIG. 7 to FIG. 8, are schematic diagrams illustrating a method of forming a high electron mobility transistor 300 according to a third embodiment in the present invention. The structure and the forming process of the high electron mobility transistor 300 are substantially similar to that in the first embodiment as shown in FIG. 2, and the high electron mobility transistor 300 also includes the substrate 110, the channel layer 130, the barrier layer 150, the two-dimensional electron gas 140, the P-type III-V composition layer 170, the gate electrode 191, the source electrode 193 and the drain electrode 195. All similarity between the present embodiment and the aforementioned embodiment will not be redundant described hereinafter. The difference between the present embodiment and the aforementioned first embodiment is in that a carbon containing layer 360 is additionally formed on the barrier layer 150.

Precisely, a carbon containing material layer (not shown in the drawings) is additionally formed on the barrier layer 150, before forming the P-type III-V composition layer 170, and a P-type III-V material layer (not shown in the drawings) and a gate electrode layer (not shown in the drawings) are sequentially formed on the carbon containing material layer to cover the entire surfaces thereof, followed by partially removing the P-type III-V material layer and the gate electrode layer, to form the gate electrode 191 and the P-type III-V composition layer 170, as well as the carbon containing layer 360.

It is noted that, a portion of the carbon containing material layer closed to the gate electrode 191 is also etched while partially removing the P-type III-V material layer and the gate electrode layer, a recess 361 is formed on the carbon containing layer 360, and the recess 361 includes a sunken surface adjacent to the gate electrode 191, with a depth of the sunken surface being gradually increased with the approach to the gate electrode 191, as shown in FIG. 7. The carbon containing layer 360 for example includes any suitable material containing carbon elements or doped with carbon atoms, for example silicon carbide or carbon doped III-V compounds, with the doped concentration of carbon thereof being about 1E15 to 1E21 in per cubic centimeter (1E15-1E21/$cm^3$). In the present embodiment, the carbon containing layer 360 includes but not limited to carbon doped III-V compound, such as carbon doped gallium nitride (C:GaN), carbon doped aluminum gallium nitride (C:AlGaN), carbon doped silicon (C:Si), or carbon doped boron nitride (C:BN), and the carbon doping method is but not limited to an in-situ doping during the epitaxial process or an additional doping after the epitaxial process. It is also noted that, the carbon containing layer 360 has a relative smaller thickness T3 in comparison with the thickness T1 of the P-type III-V composition layer 170, for example about 1/100 to 1/10 of a thickness T1 of the P-type III-V composition layer 170, but not limited thereto. For example, the thickness T3 of the carbon containing layer 360 may be about 1 to 5 nanometers, preferably to 1 to 2 nanometers, but not limited thereto.

In one embodiment, the material of the carbon containing layer 360 may be further adjustable based on the material of the P-type III-V composition layer 170 disposed above. For example, while the P-type III-V composition layer 170 includes but not limited to P-type gallium nitride (pGaN), the carbon containing layer 360 underneath preferably includes carbon doped gallium nitride, but not limited thereto; while the P-type III-V composition layer 170 includes but not limited to P-type aluminum gallium nitride (pAlGaN), the carbon containing layer 360 underneath preferably includes carbon doped aluminum gallium nitride, but not limited thereto. Furthermore, in the carbon containing layer 360 of the present embodiment, the overall carbon concentration in the carbon doped III-V compound may be 1E15 to 1E21 in per cubic centimeter (1E15-1E21/$cm^3$), preferably between 1E18 and 1E20 in per cubic centimeter (1E18-1E20/$cm^3$), to reach the lowest carbon concentration which is enable to block the divalent dopant of the P-type III-V composition layer 170 diffusing downwardly.

Next, as shown in FIG. 8, a source electrode 193 and a drain electrode 195 are formed on the carbon containing layer 360, at two sides of the P-type III-V composition layer 170 and the gate electrode 191, respectively. The source electrode 193 and the drain electrode 195 may include titanium, aluminum, titanium nitride, or other suitable conductive materials.

Through these arrangements, the forming method of the high electron mobility transistor 300 according to the third embodiment in the present invention is accomplished. According to the present embodiment, the carbon containing layer 360 is additionally formed to function like an out diffusion barrier thereby preventing from the divalent dopant within the P-type III-V composition layer 170 being diffused into the stacked layers underneath during the annealing process, and also to function like an etching stop layer while forming the P-type III-V composition layer 170 and the gate electrode 191 thereby preventing form the barrier layer 150 being recesses during patterning the P-type III-V material layer and the gate electrode layer. Then, the high electron mobility transistor 300 of the present embodiment is allowable to gain better electrical properties and performances.

Figure 9:
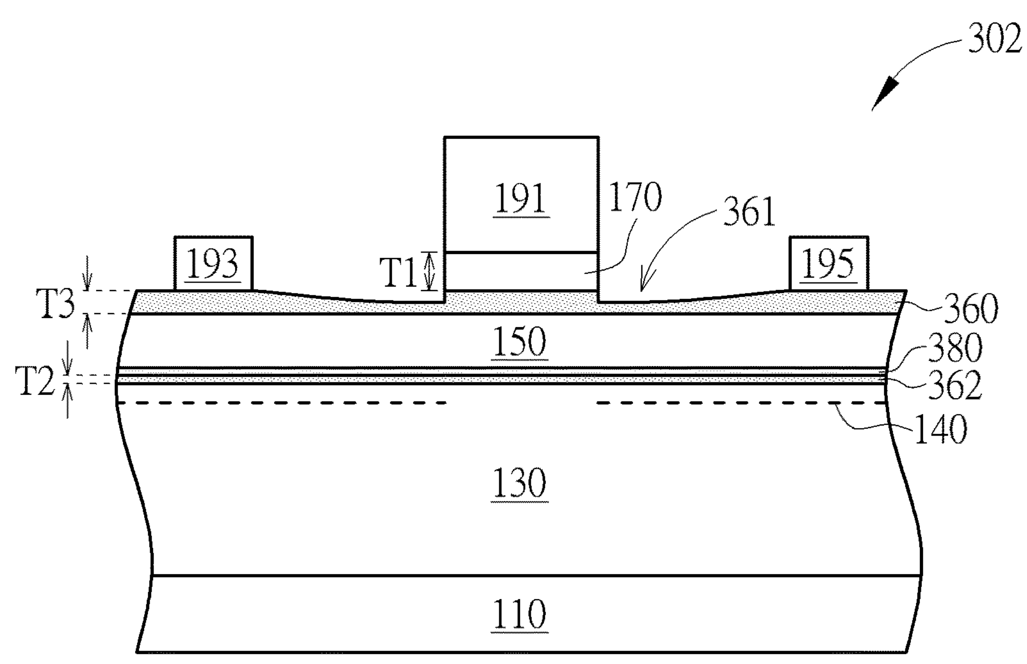
FIG. 9 is a schematic diagram illustrating a cross-sectional view of a high electron mobility transistor according to another embodiment in the present invention.
Figure 10:
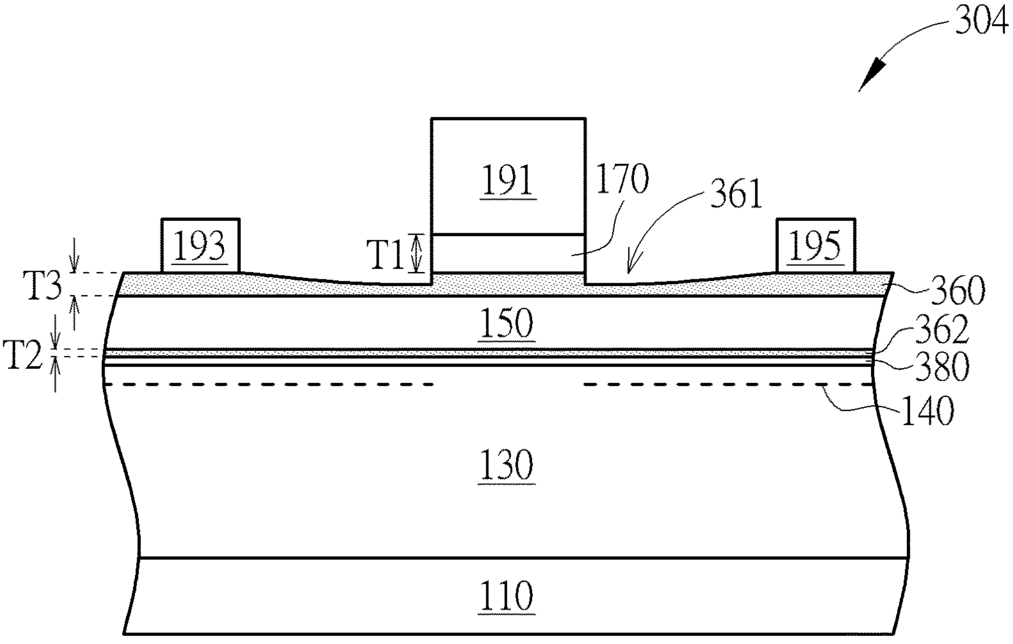
FIG. 10 is a schematic diagram illustrating a cross-sectional view of a high electron mobility transistor according to another embodiment in the present invention.

Please refer to FIG. 9 and FIG. 10, which are schematic diagrams respectively illustrating a cross-sectional view of a high electron mobility transistor 302/304 according to another embodiment in the present invention. The structure of the high electron mobility transistor 302/304 is substantially similar to that of the aforementioned third embodiment as shown in FIG. 8, and the similarity therebetween will not be redundant described hereinafter. The difference between the present embodiment and the aforementioned embodiment is mainly in that another carbon containing layer 362 and a spacer layer 380 both having planar top surfaces are further formed between the barrier layer 150 and the channel layer 130.

Precisely speaking, the carbon containing layer 362 is additionally disposed between the barrier layer 150 and the channel layer 130, and which includes any suitable material containing carbon elements or doped with carbon atoms, for example silicon carbide or carbon doped III-V compounds, with the carbon doped III-V compounds including but not limited to carbon doped gallium nitride, carbon doped aluminum gallium nitride, carbon doped silicon, or carbon doped boron nitride. In a preferably embodiment, the P-type III-V composition layer 170 may include but not limited to P-type aluminum gallium nitride ($Al_{x3}Ga_{1-x3}N$), the barrier layer 150 includes aluminum gallium nitride ($Al_{x4}Ga_{1-x4}N$), and the carbon containing layer 362 includes carbon doped aluminum gallium nitride ($Al_{x5}Ga_{1-x5}N$), with all of $_{x3}$, $_{x4}$, $_{x5}$ being a constant greater than 0, and being between 0.1 and 0.5. In one embodiment, $_{x5}$ is greater than $_{x4}$ and $_{x4}$ is greater than $_{x3}$ ($_{x5}>_{x4}>_{x3}$), and in another embodiment, $_{x4}$ is greater than $_{x3}$ and $_{x4}$ is greater than $_{x5}$ ($_{x4}>_{x5}$, $_{x4}>_{x3}$), or $_{x3}$ is greater than $_{x4}$ and $_{x4}$ is greater than $_{x5}$ ($_{x3}>_{x4}>_{x5}$). For example, the P-type III-V composition layer 170 may include P-type aluminum gallium nitride ($Al_{0.1}Ga_{0.9}N$), the barrier layer 150 includes aluminum gallium nitride ($Al_{0.2}Ga_{0.8}N$), and the carbon containing layer 362 includes carbon doped aluminum gallium nitride ($C:Al_{0.3}Ga_{0.7}N$), or the P-type III-V composition layer 170 may include P-type aluminum gallium nitride ($Al_{0.1}Ga_{0.9}N$), the barrier layer 150 includes aluminum gallium nitride ($Al_{0.3}Ga_{0.7}N$), and the carbon containing layer 362 includes carbon doped aluminum gallium nitride ($C:Al_{0.2}Ga_{0.8}N$), or the P-type III-V composition layer 170 may include P-type aluminum gallium nitride ($Al_{0.3}Ga_{0.7}N$), the barrier layer 150 includes aluminum gallium nitride ($Al_{0.2}Ga_{0.8}N$), and the carbon containing layer 362 includes carbon doped aluminum gallium nitride ($C:Al_{0.1}Ga_{0.9}N$), but is not limited thereto. Furthermore, the thickness T2 of the carbon containing layer 362 is preferably smaller than the thickness T3 of the carbon containing layer 360, for example being about 1/100 to 1/10 of the thickness T1 of the P-type III-V composition layer 170.

In addition, the spacer layer 380 may be further formed between the barrier layer 150 and the channel layer 130, either on the carbon containing layer 262 as shown in FIG. 9, or under the carbon containing layer 262 as shown in FIG. 10, and the spacer layer 380 may include a III-V material, preferably being different from the material of the barrier layer 150. Accordingly, the band gap of the barrier layer 150 may be different from that of the channel layer 130 as much as possible, so as to generate a relative larger amount of electrons to improve the electrical property of the high electron mobility transistor 302/304. In the present embodiment, the barrier layer 150 may include aluminum gallium nitride ($Al_{x2}Ga_{1-x2}N$, with $_{x2}$ being a constant greater than or equal to 0 and less than 1), and the spacer layer 380 includes but not limited to aluminum nitride (AlN). Also, the spacer layer 380 preferably includes a relative smaller thickness, for example being bout 1 to 5 nanometers, preferably being about 1 to 2 nanometers, for prevent from the depletion of the P-type III-V composition layer 170 on the two-dimensional electron gas 140 being affected thereby.

Through these arrangements, the two carbon containing layer 360, 362 are both functioned like an out diffusion barrier to prevent from the divalent dopant within the P-type III-V composition layer 170 diffusing into the channel layer 130 underneath during the annealing process, and also, the spacer layer 380 further disposed between the barrier layer 150 and the channel layer 130 in the high electron mobility transistor 302/304 of the present embodiment is allowable to gain a greater amount of electrons, to further improve the electrical property of the high electron mobility transistor 302/304.

Overall speaking, the high electron mobility transistor of the present invention includes at least one carbon containing layer to serve as an out diffusion barrier which is allowable to prevent from the dopant within the P-type III-V composition layer diffusing into the stacked layers underneath during the annealing process, and/or to serve as an etching stop layer which is allowable to prevent from recessing the barrier layer 150, so as to gain better electrical properties and performances.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:

- a substrate;
- a channel layer disposed on the substrate;
- a barrier layer disposed on the channel layer;
- a P-type III-V composition layer disposed on the barrier layer;
- a gate electrode disposed on the P-type III-V composition layer; and
- a carbon containing layer disposed on the channel layer, between the P-type III-V composition layer and the barrier layer, wherein the carbon containing layer comprises a sunken surface, wherein the barrier layer comprises a recess with a sidewall vertically aligned with a sidewall of the gate electrode, and the sunken surface of the carbon containing layer is disposed on the recess and partially overlays the sidewall of the recess.

2. The high electron mobility transistor according to claim 1, wherein a dopant concentration of carbon in the carbon containing layer is $1E15\text{-}1E21/cm^3$.

3. The high electron mobility transistor according to claim 1, wherein the carbon containing layer comprises silicon carbide, or carbon doped III-V compound.

4. The high electron mobility transistor according to claim 3, wherein the carbon doped III-V compound comprises carbon doped gallium nitride (C:GaN), carbon doped aluminum gallium nitride (C:AlGaN), carbon doped silicon (C:Si) or carbon doped boron nitride (C:BN).

5. The high electron mobility transistor according to claim 1, wherein the P-type III-V composition layer comprises a first thickness and the carbon containing layer comprises a second thickness, and the second thickness is 1/10~1/100 of the first thickness.

6. The high electron mobility transistor according to claim 1, wherein the P-type III-V composition layer comprises a divalent dopant.

7. The high electron mobility transistor according to claim 6, wherein the divalent dopant comprises magnesium (Mg), zinc (Zn), calcium (Ca), beryllium (Be) or iron (Fe).

8. The high electron mobility transistor according to claim 1, wherein the barrier layer comprises $Al_{x1}Ga_{1-x1}N$, and the $_{x1}$ is a constant greater than 0 and less than 1.

9. The high electron mobility transistor according to claim 1, further comprising:

another carbon containing layer disposed on the channel layer, between the buffer layer and the channel layer, wherein the another carbon containing layer comprises a planar surface and a dopant concentration of carbon in the carbon containing layer is 1E15-1E21/$cm^3$.

10. The high electron mobility transistor according to claim 9, further comprising:

a spacer layer disposed between the barrier layer and the channel layer.

11. The high electron mobility transistor according to claim 10, wherein the spacer layer is disposed on the another carbon containing layer.

12. The high electron mobility transistor according to claim 10, wherein the spacer layer is disposed under the another carbon containing layer.

13. The high electron mobility transistor according to claim 10, wherein the barrier layer comprises $Al_{x2}Ga_{1-x2}N$, and the $_{x2}$ is a constant greater than or equal to 0 and less than 1.

14. The high electron mobility transistor according to claim 13, wherein the spacer layer comprises a III-V material which is different from a III-V material of the barrier layer.

15. The high electron mobility transistor according to claim 1, further comprising a source electrode and a drain electrode disposed on the carbon containing layer, at two sides of the gate electrode.

16. The high electron mobility transistor according to claim 1, wherein sidewalls of the P-type III-V composition layer are vertical aligned with two sides of the gate electrode.

17. A method of forming a high electron mobility transistor, comprising:

providing a substrate;

forming a channel layer on the substrate;

forming a barrier layer on the channel layer;

forming a P-type III-V composition layer on the barrier layer;

forming a gate electrode on the P-type III-V composition layer; and forming a carbon containing layer on the channel layer, between the P-type III-V composition layer and the barrier layer, wherein the carbon containing layer is formed after forming the P-type III-V composition layer, and the carbon containing layer comprises a sunken surface.

18. The method of forming a high electron mobility transistor according to claim 17, wherein the carbon containing layer is formed while forming the P-type III-V composition layer.

19. The method of forming a high electron mobility transistor according to claim 18, further comprising:

forming another carbon containing layer on the channel layer, between the buffer layer and the channel layer, wherein the another carbon containing layer comprises a planar surface and a thickness of the another carbon containing layer is greater than a thickness of the carbon containing layer.

* * * * *